United States Patent [19]

Lee

[11] Patent Number: 5,200,652
[45] Date of Patent: Apr. 6, 1993

[54] PROGRAMMABLE/REPROGRAMMABLE STRUCTURE COMBINING BOTH ANTIFUSE AND FUSE ELEMENTS

[75] Inventor: Roger R. Lee, Boise, Id.

[73] Assignee: Micron Technology, Inc., Boise, Id.

[21] Appl. No.: 791,797

[22] Filed: Nov. 13, 1991

[51] Int. Cl.⁵ .......................................... H03K 19/173
[52] U.S. Cl. .................................. 307/465; 307/465.1; 365/96
[58] Field of Search .................. 307/202.1, 465, 465.1; 365/96, 102, 225.7

[56] References Cited

U.S. PATENT DOCUMENTS

| | | | |
|---|---|---|---|
| 4,272,833 | 6/1981 | Taylor | 365/96 |
| 4,441,167 | 4/1984 | Principi | 365/96 |
| 4,873,459 | 10/1989 | El Gamel et al. | 307/465 |
| 5,034,925 | 7/1991 | Kato | 365/225.7 |

Primary Examiner—Edward P. Westin
Assistant Examiner—Andrew Sanders
Attorney, Agent, or Firm—David J. Paul

[57] ABSTRACT

The present invention comprises a programmable structure for a integrated circuits, such as programmable read-only memory (PROM) or option selections/redundancy repair on dynamic random access memories (DRAMs), which utilizes both antifuse and fuse elements for multiple programming. Various combinations of anti-fuse and fuse elements (series or series-parallel combinations) will allow multiple programming of a given node in a particular circuit design to allow greater programming flexibility.

20 Claims, 1 Drawing Sheet

PROGRAMMABLE/REPROGRAMMABLE STRUCTURE COMBINING BOTH ANTIFUSE AND FUSE ELEMENTS

FIELD OF THE INVENTION

This invention relates to the field of semiconductor devices. More specifically, a concept is described which allows multiple programming of semiconductor devices, such as non-volatile memory devices, by utilizing a combination of both anti-fuse and fuse elements.

BACKGROUND OF THE INVENTION

A read only memory (ROM) consists of an array of semiconductor devices (diodes, bipolar or field-effect transistors) which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit which is expensive and feasible only when a large quantity of the same data array is required.

EPROMs use a special charge-storage mechanism to enable or disable the switching elements in the memory array. In this case, appropriate voltage pulses to store electrical charges at the memory array locations is provided. The data stored in this manner is generally permanent until it is erased using ultraviolet light allowing it to once again be programmed.

PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

SUMMARY OF THE INVENTION

The present invention presents a concept of combining the anti-fuse and fuse elements together in various combinations which will allow multiple programming of a given node in a particular circuit design. For example, placing an antifuse in series with a fuse allows that particular programmable node to initially be an open, then be programmed as a short or finally back to an open. Or as another example, a fuse placed in parallel with a series combination of an anti-fuse and a fuse would allow this node to initially be a short, then be programmed in the sequence of an open, back to a short or finally back to an open.

Even greater programming flexibility may be added by increasing the number and combinations of programmable elements, however the extent to which the number of elements that may be added will be limited by die space and as well as other economical considerations.

The great advantages of the approach of the present invention becomes obvious as one skilled in the art will appreciate the programming flexibility this offers to integrated circuit designs that require hardware programming, such as in PROMs. Now a PROM could be reprogrammed to retain entirely different data than its original programmed state. For example, as prototype system designs using PROMs are fine tuned by design changes, it may require a different PROM configuration, meaning the old PROM is discarded and a new one programmed. But by using the fuse anti-fuse combination, the old PROM may now be reused because multiple programming is available.

Though the present invention suggests on integrating the multiple programmable elements specifically into a PROM it will be obvious to one skilled in the art to implement this approach into other programmable integrated circuits, such as programmable logic arrays (PLAs), programmable array logic (PALs), dynamic random access memories (DRAMs) and the like or simply logic circuits in general.

DETAILED DESCRIPTION OF THE PREFERRED EMBODIMENT

Figure 3:
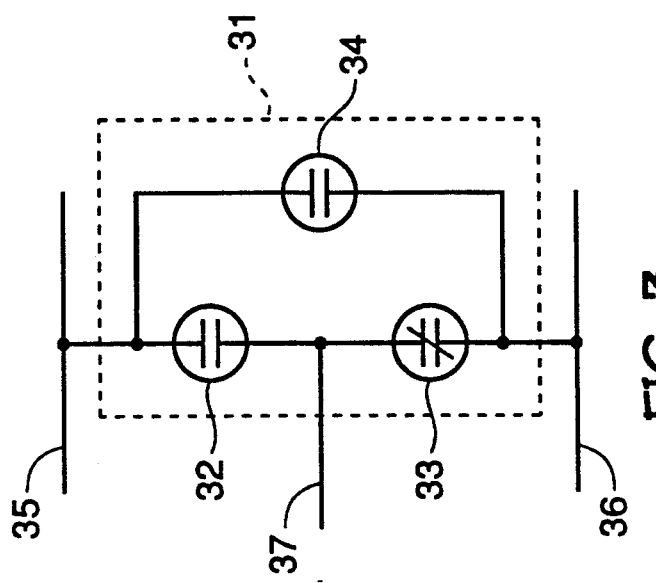
FIG. 3 shows a schematical representation of the present invention depicting a programmable fuse element in parallel with a series combination of a programmable antifuse element and a programmable fuse element.
Figure 2:
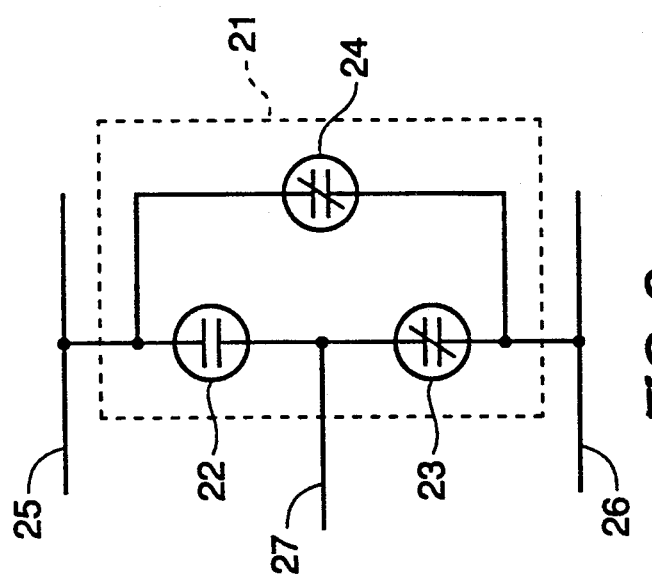
FIG. 2 shows a schematical representation of the present invention depicting a programmable antifuse element in parallel with a series combination of a programmable antifuse element and a programmable fuse element.
Figure 1:
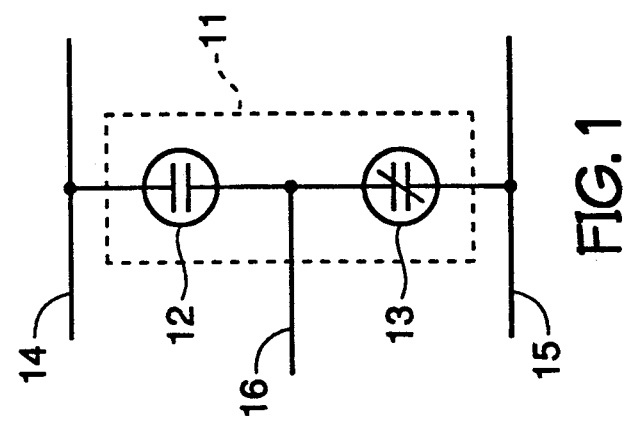
FIG. 1 shows a schematical representation of the present invention depicting a programmable antifuse element in series with a programmable fuse element.

Existing fabrication techniques, known by one skilled in the art, may be used to construct the desired combination of multiple programmable elements depicted in FIGS. 1–3. Discussion of the present invention will now follow.

FIG. 1 depicts a schematical representation of a first embodiment of the present invention showing a programmable structure 11 comprising antifuse 12 in series with fuse 13 between first and second conductors 14 and 15, respectively. Access is provided to both sides of antifuse 12 and fuse 13 via access node 16 (or a third conductor 16) along with first and second conductors 14 and 15, in order to allow programming of one or both of these two elements. In this configuration, structure 11 initially provides an open between conductors 14 and 15 by virtue of antifuse 12 possessing inherent characteristics of being a nonconducting element when in an unprogrammed state. Structure 11 may then be programmed to provide a short between conductors 14 and 15 by applying a programming voltage (usually 10 to 12V) across antifuse 12 via conductor 14 and access node 16, thereby shorting antifuse 12. Structure 11 may be programmed a second time to provide an open between conductors 14 and 15 by applying a programming voltage across antifuse 12 via conductor 14 and access node 16 thereby shorting antifuse 12. This option results in an open-short-open programming selection.

FIG. 2 depicts a schematical representation of a second embodiment of the present invention showing a programmable structure 21 comprising antifuse 22 in series with fuse 23, with this series combination in parallel with a second fuse 24, all of which reside between first and second conductors 25 and 26, respectively. Access is provided to both sides of antifuse 22, fuse 23 or antifuse 24 via access node 27 (or third conductor 27) along with first and second conductors 25 and 26, in order to allow programming of any one of these three elements. Resulting from this combination is a short-open-short-open programming scenario. In this configuration structure 21 initially provides a short between conductors 25 and 26 by virtue of fuse 24 possessing inherent characteristics of being a conducting element when in an unprogrammed state. Structure 21 may then be programmed to provide an open between conductors 24 and 25 by applying a programming voltage across fuse 24 via conductors 25 and 26, thereby opening fuse 24. Structure 21 may be programmed a second time to provide a short between conductors 25 and 26 by applying a programming voltage across antifuse 22 via conductor 25 and access node 27, thereby shorting antifuse 22. Structure 21 may be programmed a third time to provide an open between conductors 25 and 26 by applying a programming voltage across fuse 23 via conductors 25 and access node 27, thereby opening fuse 23.

FIG. 3 depicts a schematical representation of a third embodiment of the present invention showing a programmable structure 31 comprising antifuse 32 in series with fuse 33, with this series combination in parallel with a second antifuse 34, all of which reside between first and second conductors 35 and 36, respectively. Access is provided to both sides of antifuse 32, fuse 33 or fuse 34 via access node 37 (or third conductor 37) along with first and second conductors 35 and 36, in order to allow programming of any one of these three elements. Resulting from this combination is an open-short-open-short programming scenario. In this configuration, structure 31 initially provides an open between conductors 35 and 36 by virtue of antifuses 32 and 34 possessing inherent characteristics of being a nonconducting elements when in an unprogrammed state. Structure 31 may then be programmed to provide a short between conductors 35 and 36 by applying a programming voltage across antifuse 32 via conductor 35 and access node 37, thereby shorting antifuse 32. Structure 31 may be programmed a second time to provide an open between conductors 35 and 36 by applying a programming voltage across fuse 33 via conductor 36 and access node 37, thereby opening fuse 33. Structure 31 may be programmed a third time to provide a short between conductors 35 and 36 by applying a programming voltage across antifuse 34 via conductors 35 and 36 thereby shorting antifuse 34.

It is to be understood that although the present invention has been described with reference to embodiments, various modifications known to those skilled in the art, such as changing the programming order of a given combinations of programmable elements or by creating additional combinations of programmable elements to allow even more programming flexibility, may be made to the programmable structures presented herein without departing from the invention as recited in the several claims appended hereto.

I claim:

1. A programmable/reprogrammable structure in an integrated circuit comprising:
   first and second conductors; and
   a combination of one-time programmable elements coupled therebetween;
   wherein said one-time programmable elements comprise an antifuse element coupled in series to a first fuse element via a third conductor thereby forming an antifuse/fuse series combination and a second fuse element coupled in parallel to said series combination, thereby providing a programming sequence having an initial state and first, second and third programmable states.

2. A programmable/reprogrammable structure in an integrated circuit comprising:
   first and second conductors; and
   a combination of one-time programmable elements coupled therebetween;
   wherein said one-time programmable elements comprise a first antifuse element coupled in series to a first fuse element via a third conductor thereby forming an antifuse/fuse series combination and a second antifuse element coupled in parallel to said series combination, thereby providing a programming sequence having an initial state and first, second and third programmable states.

3. The programmable/reprogrammable structure of claim 1 wherein said programming sequence comprises a first shorted state, a first open state, a second shorted state and a second open state.

4. The programmable/reprogrammable structure of claim 1 wherein said first antifuse element is programmed as a short by applying a voltage potential between said first and third conductors.

5. The programmable/reprogrammable structure of claim 1 wherein said fuse element is programmed as an open by applying a voltage potential between said second and third conductors.

6. The programmable/reprogrammable structure of claim 1 wherein said second fuse element is programmed as an open by applying a voltage potential between said first and second conductors.

7. The programmable/reprogrammable structure of claim 2 wherein said programming sequence comprises a first open state, a first shorted state, a second open state and a second shorted state.

8. The programmable/reprogrammable structure of claim 2 wherein said first antifuse element is programmed as a short by applying a voltage potential between said first and third conductors.

9. The programmable/reprogrammable structure of claim 2 wherein said fuse element is programmed as an open by applying a voltage potential between said second and third conductors.

10. The programmable/reprogrammable structure of claim 2 wherein said second antifuse element is programmed as a short by applying a voltage potential between said first and second conductors.

11. The programmable/reprogrammable structure of claim 1 wherein said integrated circuit comprises a memory device.

12. The integrated circuit of claim 11 wherein said memory device comprises a programmable read only memory.

13. The integrated circuit of claim 11 wherein said memory device comprises a random access memory.

14. The integrated circuit of claim 11 wherein said memory device comprises a programmable logic array.

15. The integrated circuit of claim 11 wherein said memory device comprises programmable array logic.

16. The programmable/reprogrammable structure of claim 2 wherein said integrated circuit comprises a memory device.

17. The integrated circuit of claim 16 wherein said memory device comprises a programmable read only memory.

18. The integrated circuit of claim 16 wherein said memory device comprises a random access memory.

19. The integrated circuit of claim 16 wherein said memory device comprises a programmable logic array.

20. The integrated circuit of claim 16 wherein said memory device comprises programmable array logic.

* * * * *